United States Patent
Naaman

(10) Patent No.: US 9,917,580 B2
(45) Date of Patent: Mar. 13, 2018

(54) SUPERCONDUCTING SINGLE-POLE DOUBLE-THROW SWITCH SYSTEM

(71) Applicant: Ofer Naaman, Ellicott City, MD (US)

(72) Inventor: Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/663,780

(22) Filed: Jul. 30, 2017

(65) Prior Publication Data

US 2018/0026633 A1  Jan. 25, 2018

Related U.S. Application Data

(63) Continuation of application No. 14/616,451, filed on Feb. 6, 2015, now Pat. No. 9,768,771.

(51) Int. Cl.
G01R 33/02 (2006.01)
G01R 33/035 (2006.01)
H03K 17/92 (2006.01)

(52) U.S. Cl.
CPC .................................. *H03K 17/92* (2013.01)

(58) Field of Classification Search
CPC .................................................... G01R 33/02
USPC ................................. 324/248; 505/162, 846
See application file for complete search history.

(56) References Cited

U.S. PATENT DOCUMENTS

| 4,509,018 | A | 4/1985 | Gershenson |
|---|---|---|---|
| 4,785,426 | A | 11/1988 | Harada et al. |
| 5,334,884 | A | 8/1994 | Tesche |
| 5,767,043 | A | 6/1998 | Cantor et al. |
| 5,982,219 | A | 11/1999 | Kirichenko |
| 6,337,567 | B1 | 1/2002 | Lee et al. |
| 6,362,617 | B1 | 3/2002 | Hubbell |
| 7,388,371 | B2 | 6/2008 | Kim et al. |
| 8,933,695 | B1 | 1/2015 | Kornev et al. |
| 9,509,274 | B2 | 11/2016 | Naaman et al. |
| 2012/0094838 | A1 | 4/2012 | Bunyk et al. |
| 2015/0092465 | A1 | 4/2015 | Herr et al. |
| 2016/0164505 | A1 | 6/2016 | Naaman et al. |
| 2017/0062107 | A1 | 3/2017 | Naaman et al. |

FOREIGN PATENT DOCUMENTS

| EP | 0527557 A1 | 2/1993 |
|---|---|---|
| WO | WO2009/149086 A2 | 12/2009 |
| WO | WO 2015/050622 | 4/2015 |

*Primary Examiner* — Bot Ledynh
(74) *Attorney, Agent, or Firm* — Tarolli, Sundheim, Covell & Tummino LLP

(57) ABSTRACT

A superconducting switch system is provided that includes a filter network having a first SQUID coupled to a second SQUID via a common node, an input port coupled to the common node, a first output port coupled to the first SQUID, and a second output port coupled to the second SQUID. The superconducting switch system also includes a switch controller configured to control an amount of induced current through the first SQUID and the second SQUID to alternately switch the first and second SQUIDS between first inductance states in which a desired bandwidth portion of a signal provided at the input terminal passes to the first output terminal and is blocked from passing to the second output terminal, and second inductance states in which the desired bandwidth portion of the input signal passes to the second output terminal and is blocked from passing to the first output terminal.

16 Claims, 4 Drawing Sheets

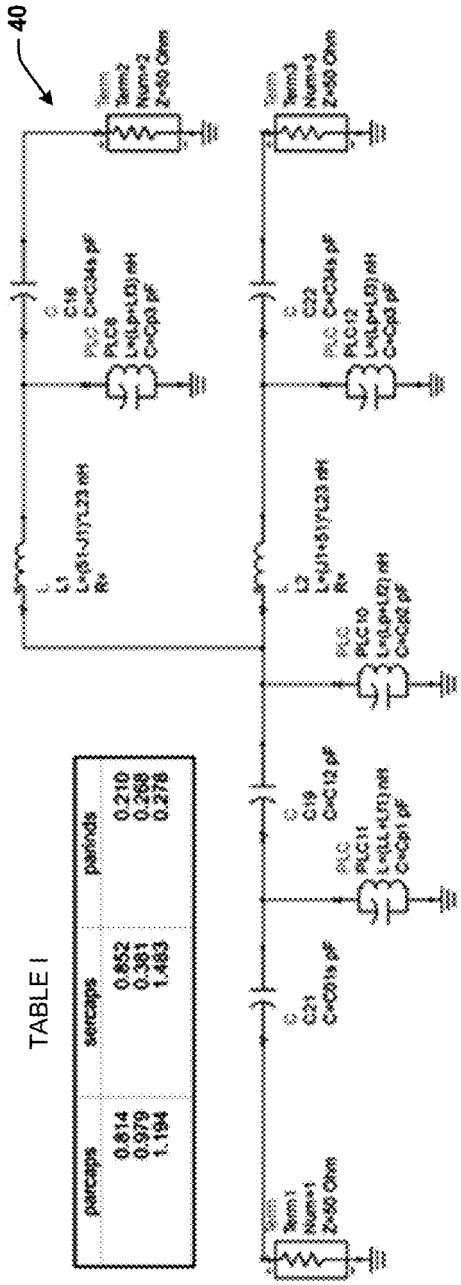
FIG. 3
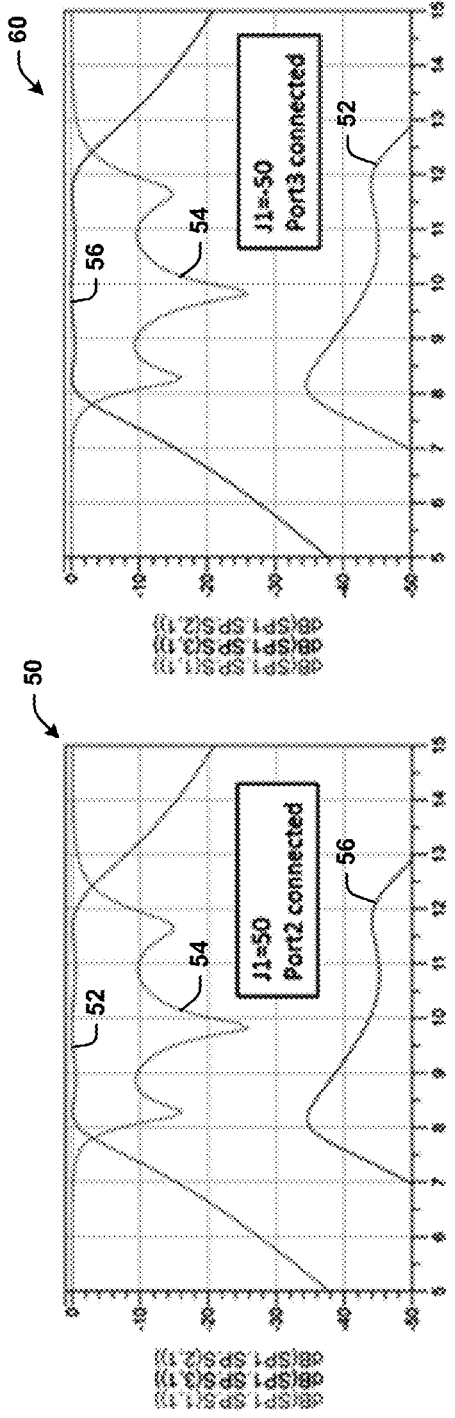
FIG. 4
FIG. 5

SUPERCONDUCTING SINGLE-POLE DOUBLE-THROW SWITCH SYSTEM

RELATED APPLICATIONS

This application is a divisional of U.S. patent application Ser. No. 14/616,451, filed 6 Feb. 2015, which is incorporated herein in its entirety.

TECHNICAL FIELD

The present invention relates generally to superconducting circuits, and more particularly to a superconducting single-pole double-throw switch system.

BACKGROUND

Conventional microwave mechanical, electro-mechanical, and electronic switches may not compatible with on-chip integration and cryogenic operation of superconducting electronic circuits, because of incompatible fabrication processes and high power dissipation. Likewise, tunable filters that are commonly realized by use of either active components such as voltage-variable capacitors i.e. varactors, mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffered from high return loss, limited usable bandwidth, and poor out-of-band off-state isolation.

SUMMARY

In one example, a superconducting switch system is provided that comprises a first Superconducting Quantum Interference Device (SQUID) having a first variable inductance coupling element, and a second SQUID having a second variable inductance coupling element. The second SQUID is coupled to the first SQUID through a common node. The superconducting switch system further comprises a first terminal coupled to the common node, a second terminal coupled to the first SQUID through an end opposite the common node, a third terminal coupled to the second SQUID through an end opposite the common node, and a switch controller. The switch controller is configured to control the setting of the first variable inductance coupling element and the second variable inductance coupling element between opposing inductance states to allow selective routing of signals between one of a first path between the first terminal and the second terminal and a second path between the first terminal and the third terminal.

In yet another example, a superconducting switch system comprises a filter network having a first SQUID coupled to a second SQUID via a common node, an input port coupled to the common node, a first output port coupled to the first SQUID, and a second output port coupled to the second SQUID. The superconducting switch system also comprises a switch controller configured to control an amount of induced current through the first SQUID and the second SQUID to alternately switch the first and second SQUIDs between first inductance states in which a desired bandwidth portion of a signal provided at the input terminal passes to the first output terminal and is blocked from passing to the second output terminal, and second inductance states in which the desired bandwidth portion of the input signal passes to the second output terminal and is blocked from passing to the first output terminal.

In yet a further example, a superconducting switch is provided that comprises a first SQUID having a first inductor, a first Josephson junction and a common inductor arranged in a first superconducting loop, and a second SQUID having the common inductor, a second Josephson junction and a second inductor arranged in a second superconducting loop. A first terminal is coupled to a common node, which connects to a first end of the common inductor, a first end of the first Josephson junction and a first end of the second Josephson junction. A second terminal is coupled to a second end of the first Josephson junction and a first end of the first inductor, and a third terminal is coupled to a second end of the second Josephson junction and a first end of the second inductor. A common mode flux bias line includes a common bias inductor inductively coupled to common inductor, and a differential mode flux bias line that includes a first differential bias inductor inductively coupled to the first inductor, and a second differential bias inductor inductively coupled to the second inductor.

BRIEF DESCRIPTION OF THE DRAWINGS

FIG. 3 illustrates a circuit schematic for simulation utilization with the junctions $J_1$ and $J_2$ of FIG. 2 modeled as inductors L1 and L2.

FIG. 4 illustrates a graph showing the transmission of an input signal from input port terminal 1 to output port terminal 2 and the blocking of the input signal from transmission to the output port terminal 3.

FIG. 5 illustrates a graph showing the transmission of an input signal from input port terminal 1 to output port terminal 3 and the blocking of the input signal from transmission to the output port terminal 2.

DETAILED DESCRIPTION

Figure 1:
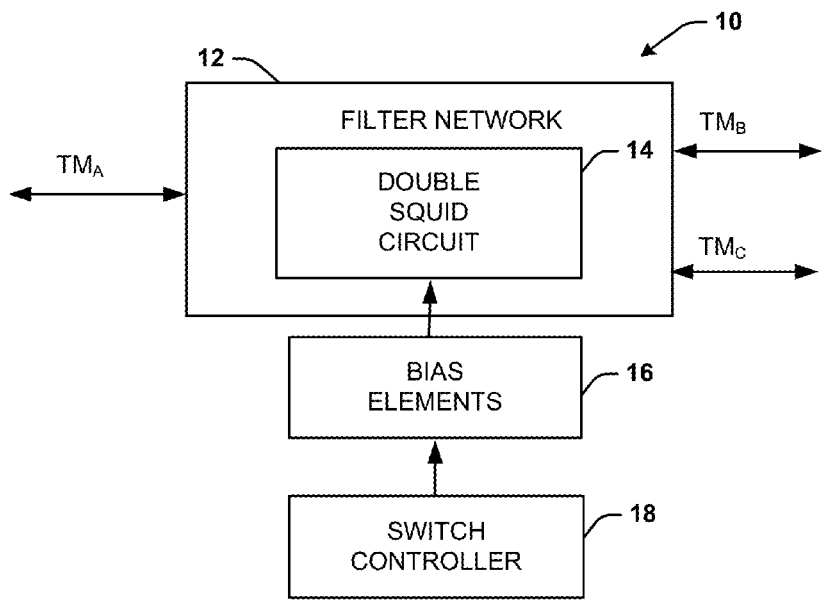
FIG. 1 illustrates a block diagram of an example of a superconducting single-pole double-throw switch system.

The present disclosure relates generally to superconducting circuits, and more particularly to a superconducting single-pole double-throw switching system. The superconducting single-pole double-throw switching system can include a first variable inductance coupler (also referred to as variable inductance coupling element) that couples and decouples a first section of a filter network and a second section of the filter network, also referred to as a first path, and a second variable inductance coupler that couples and decouples the first section of the filter network and a third section of the filter network, also referred to as a second path. The first and second variable inductance couplers can be controlled to have a first inductance state of the switching system, which allows passing of signals between the first and second sections of the filter network, while blocking signals from passing from the first and third sections of the filter network. Furthermore, the first and second variable inductance couplers can be controlled to have a second inductance state of the switching system, which allows passing of signals between the first and third sections of the filter network, while blocking signals from passing from the first and second sections of the filter network.

In one example, the first and second variable inductance couplers are each elements of adjacent Radio Frequency (RF) Superconducting Quantum Interference Devices (hereinafter, referred to as RF SQUIDs or SQUIDs). A first Superconducting Quantum Interference Devices (SQUID) can include a first inductor and a second inductor coupled to opposite sides of the first variable inductance coupler. A second SQUID can include the second inductor and a third inductor coupled to opposite sides of the second variable inductance coupler. The second inductor can be a common inductor that couples both the first and second SQUID to one another to form a double SQUID circuit configuration. A variable inductance coupler can be, for example, a Josephson junction that has an induction that can be varied based on a current flowing through the Josephson junction. The current flowing through a given Josephson junction can be induced based on a flux applied to a respective SQUID.

In one example, the first and second Josephson junctions can have a first inductance when no current or a low current is induced in the respective SQUID, and a second inductance when a current or a higher current is induced in the respective SQUID that is at a predetermined threshold that generates or induces a flux, for example, greater than about 0.1 $\Phi_0$ and less than about 0.45 $\Phi_0$, where $\Phi_0$ is equal to a flux quantum. The first inductance (e.g., $\hbar/2e*1/I_C$, where $\hbar$ is Planck's constant divided by $2\pi$, e is electron charge and $I_C$ is the critical current of the Josephson junction) can provide coupling between desired sections of a filter network such to allow passing of a desired bandwidth portion of an input signal between opposing ends of the the desired sections. The second inductance (e.g., large inductance value) can provide decoupling between the sections of the filter network such that the passing of the desired bandwidth portion of the input signal is blocked between opposing ends of the undesired sections.

FIG. 1 illustrates an example of a superconducting single-pole double-throw switch system 10. The superconducting single-pole double-throw switch system 10 routes signals from a first terminal ($TM_A$) to one of a second terminal ($TM_B$) or a third terminal ($TM_C$). Alternatively, the signals can be routed from one of the second terminal $TM_B$ or the third terminal $TM_C$ to the first terminal $TM_A$. The superconducting single-pole double-throw switch system 10 can be implemented in any of a variety of superconducting circuit systems to provide switch control of signals between two alternate paths. As an example, the signals can be a microwave signal that is implemented in a control scheme for a quantum circuit, such as performing a gate or a readout operation on a qubit. As another example, the signal can be a signal pulse, a communication signal, or a control command signal. The superconducting switch system 10 can provide a band-pass filtered output signal that can corresponds to a desirable portion (e.g., particular frequency bandwidth) of a signal passing through one of a first path and a second path. Additionally, the desired portion of the signal can be blocked such that none of the desired portion of the signal is allowed to pass though the other of the first path and the second path.

As one example, the superconducting switch system 10 includes a microwave band-pass filter network 12 that can include one or more impedance components (i.e., capacitors, resistors, inductors) for configuring an input portion of the filter network 12 as one or more input resonators, and a pair of output portions of the filter network 12 each having one or more output resonators. The filter network 12 can include a double SQUID circuit 14 that includes a first SQUID with a first variable inductance coupler associated with a first path, and a second SQUID with a second variable inductance coupler associated with a second path. The first and second SQUIDs can each also include one or more components that operate both as components of a superconducting loop of the respective SQUIDs, and impedance components of the one or more input and/or the one or more output resonators. Additionally, the first and second SQUIDs can also include one or more components that are shared between the first and second SQUIDs. The first and second SQUIDs operate as the active elements in the superconducting switch, such that the flux-tunable inductance of the SQUIDs can selectively couple sections of the filter circuit to provide passing of signals between one of two paths, and blocking of signals between the other of the two paths. The SQUIDs are embedded in the microwave band-pass filter network 12 to provide matching to the 50 Ohm impedance environment.

A set of bias elements 16 are inductively coupled to the first and second SQUIDs in a configuration that provides for inducement of a net flux as a result of a net current in one of the first SQUID and second SQUID that exceeds a predetermined threshold (e.g., a net flux of a substantial fraction of one half of a flux quantum), and a net flux as a result of a net current in the other of the first SQUID and second SQUID that falls substantially below the predetermined threshold (e.g., approximately 0 net flux). A net flux or current induced in one of the SQUIDs that exceeds the predetermined threshold results in a high inductance for the SQUID's associated variable inductance coupler, and blocking of signals through that respective SQUID. A net flux or current induced in one of the SQUIDs that falls substantially below the predetermined threshold results in a low inductance for the SQUID's associated variable inductance coupler, and the passing of signals through that respective SQUID. The bias elements 16 can be controlled by a switch controller 18 that controls an amount and polarities of bias current to the bias elements 16, which in turn, controls an amount of current and flux induced in each respective SQUID and flowing through the variable inductance couplers of each respective SQUID.

Figure 2:
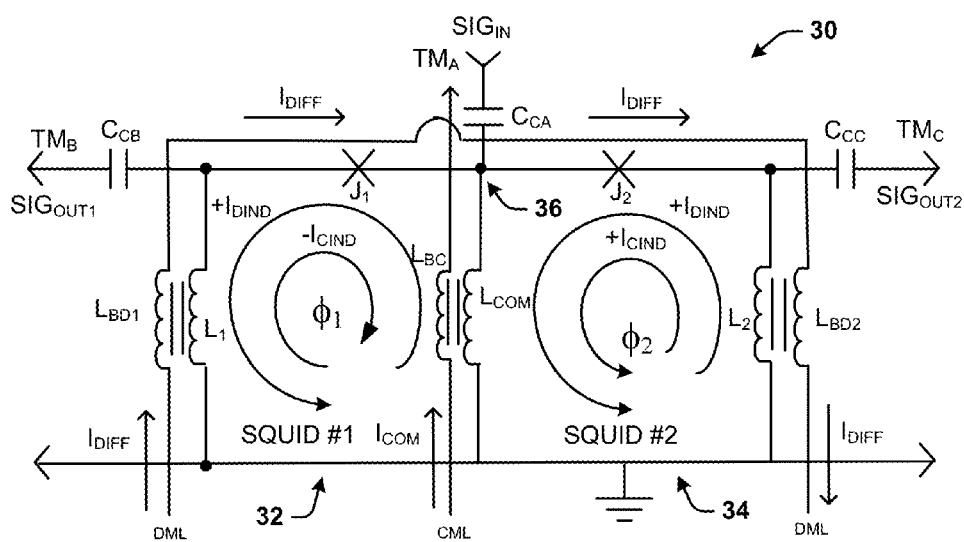
FIG. 2 illustrates a schematic diagram of an example of a single-pole double-throw switch circuit.

FIG. 2 illustrates a schematic diagram of a single-pole double-throw switch circuit 30. As illustrated in FIG. 2, Josephson junction $J_1$ is connected to a first inductors $L_1$ and a common inductor $L_{COM}$ to form a first RF-SQUID 32 (SQUID #1) enclosing externally applied flux $\Phi_1$. Likewise, Josephson junction $J_2$ is connected to a second inductor $L_2$ and the common inductor $L_{COM}$ to form a second RF-SQUID 34 (SQUID #2) enclosing externally applied flux $\Phi_2$. The opposite ends of the first inductor $L_1$, the common inductor $L_{COM}$ and the second inductor $L_2$ are coupled to a common reference point (ground) to form a first superconducting loop associated with the first RF SQUID 32, and to form a second superconducting loop associated with the second RF SQUID. The Josephson junctions critical currents are such that $I_{c1,2}(L_{1,2}+L_{com})<\Phi_0$. The effective inductances of junctions $J_1$ and $J_2$ are functions of the applied fluxes $\Phi_1$ and $\Phi_2$, respectively. When the applied flux is approximately zero, the inductance of the respective junction is given by $L=\hbar/2eI_c$, where $I_c$ is the junction critical current. The junction inductance increases with applied flux until it diverges when the flux reaches a value near $\Phi_0/2$ (the exact value depends on the product of the junction critical current and the self-inductance of the RF-SQUID loop).

An input terminal ($TM_A$) or port is coupled to a common node 36 of the first and second RF SQUIDs 32 and 34 through an input coupling capacitor $C_{CA}$. A first output terminal ($TM_B$) or port is connected to the first RF SQUID 32 through a first output coupling capacitor $C_{CB}$, and a second output terminal ($TM_B$) or port is connected to the second RF SQUID through a second output coupling capacitor ($TM_C$). It is to be appreciated that for the switch circuit 30 to operate as a proper functioning filter circuit, capacitors would be need to be placed in parallel to $L_1$, $L_2$ and $L_{COM}$ similar to the filter arrangements shown in FIGS. 3 and 6. A differential-mode flux bias line (DML) is provided that includes a first differential mode bias inductor ($L_{BD1}$) inductively coupled to the first inductor L1, and a second differential mode bias inductor ($L_{BD1}$) inductively coupled to the second inductor L2. Additionally, a common mode flux bias line (CML) is provided that includes a common mode bias inductor ($L_{BC}$) is inductively coupled to the common inductor ($L_{COM}$). A switch controller (not shown) can control the magnitude and direction of current applied to the differential-mode flux bias line (DML) and the common mode flux bias line (CML) to control the amount and polarity of flux applied to each SQUID, and thus, the inductance of the first Josephson junction J1 and the second Josephson junction J2.

Fluxes $\Phi_1$ and $\Phi_2$ can be applied in such a way that one of junctions $J_1$ or $J_2$ has a low inductance in response to one of flux $\Phi_1$ or $\Phi_2$ being essentially zero, while the other junction has a large inductance in response to the to the other of flux $\Phi_1$ or $\Phi_2$ being a substantial fraction of $\Phi_0/2$. In this example, an input signal $SIG_{IN}$ (e.g., a microwave signal) will flow from an input port ($TM_A$) through a selected low inductance junction ($J_1$ or $J_2$) to a selected output port ($TM_A$ or $TM_B$) as an output signal ($SIG_{OUT1}$ or $SIG_{OUT2}$), while the non-selected port (the other of $TM_A$ or $TM_B$) connected to an unselected high inductance junction (the other of J1 or J2) remains isolated. By controlling the applied fluxes $\Phi_1$ and $\Phi_2$, the input signal $SIG_{IN}$ can be routed from the input port to one of the output ports, while isolating the other of the output ports from passing the input signal.

FIG. 2 demonstrates how the fluxes $\Phi_1$ and $\Phi_2$ can be controlled individually by applying two bias currents through the device's common mode bias line (CML) and differential mode bias line (DML). The applying of the bias current induces currents in the first and second SQUIDs via superconducting transformers formed from the first differential mode bias inductor $L_{BD1}$ inductively coupled to the first inductor $L_1$, the second bias inductor $L_{BD2}$ inductively coupled to the second inductor $L_1$, and the common mode bias inductor $L_{BC}$ inductively coupled to the common inductor $L_C$. The control lines are configured such that the flux induced by the common-mode flux bias line (CML) adds to that induced by the differential-mode flux bias line (DML) in one of the SQUIDs, while it subtracts from it in the other of the SQUIDs.

For example, a DC current $I_{COM}$ can be applied through the line labeled as the common-mode flux line (CML) to induce a flux of 0.2 $\Phi_0$ in both the first and second SQUIDs 32 and 34, respectively, which induces a current $-I_{CIND}$ in the first SQUID 32 and a current $+I_{CIND}$ in the second SQUID 34. A DC current $+I_{DIND}$ is applied through the line labeled as differential mode flux line (DML) to induce a flux of 0.2 $\Phi_0$ in the first SQUID 32 and $-0.2$ $\Phi_0$ in the second SQUID 34, which results in a current of $+I_{DIND}$ in the first SQUID 32 and $+I_{DIND}$ in the second SQUID 34. This results in the second SQUID 34 enclosing a total applied flux of 0.4 $\Phi_0$ (resulting in a high inductance for Josephson junction $J_2$) while the first SQUID encloses a zero total applied flux (low inductance for Josephson junction $J_1$). The polarity of the current flowing in one of the differential mode flux bias line (DML) or the common mode flux bias line (CML) can be changed to change the net flux and net current in the first and second RF SQUIDs 32 and 34, respectively, thus resulting in the control of routing of the input signal $SIG_{IN}$ between one output port (e.g. $TM_A$) or the other ($TM_B$).

The single-pole double-throw switch circuit 30 can be embedded in a band-pass filter to properly match the single-pole double-throw switch circuit to a 50 Ohm environment. FIG. 3 illustrates a circuit schematic for simulation utilization with the junctions $J_1$ and $J_2$ of FIG. 2 modeled as inductors L1 and L2. FIG. 3 further illustrates the embedding of the band-pass filter, designed to have Chebychev response centered at 10 GHz. The values of components for this particular filter design are shown in Table I of FIG. 3.

FIGS. 4-5 illustrate graphical responses of gain versus frequency of an S-parameter simulation in Agilent ADS of the circuit in FIG. 3. FIG. 4 illustrates a graph 50 showing the transmission of an input signal from input port terminal 1 to output port terminal 2 (the $S_{21}$ response is plotted as reference numeral 52) and the blocking of the input signal from transmission to the output port terminal 3 (the $S_{31}$ response is plotted as reference numeral 56), as well as the reflection of the input signal at input port terminal 1 ($S_{11}$ reflection response is plotted as reference numeral 54). FIG. 5 illustrates a graph 60 showing the blocking of the input signal from input port terminal 1 to output port terminal 2 (the $S_{21}$ response is plotted as reference numeral 52) and the transmitting of the input signal from transmission to the output port terminal 3 (the $S_{31}$ response is plotted as reference numeral 56), as well as the reflection of the input signal at input port terminal 1 ($S_{11}$ reflection response is plotted as reference numeral 54).

The response of the junction inductances to applied flux is modeled here by increasing the respective inductance by a factor of 100, while the other junction inductance with a substantial applied flux is maintained unaltered. In the graph 50 of FIG. 4, the inductance of L2 (reference to J2 of FIG. 2) is scaled by a factor of 100, thus routing the signal from input port terminal 1 to output port terminal 2. In the graph 60 of FIG. 5, the inductance of L1 (reference to J1 of FIG. 2) is scaled by a factor of 100 thus routing the signal from input port terminal 1 to output port terminal 3.

Figure 6:
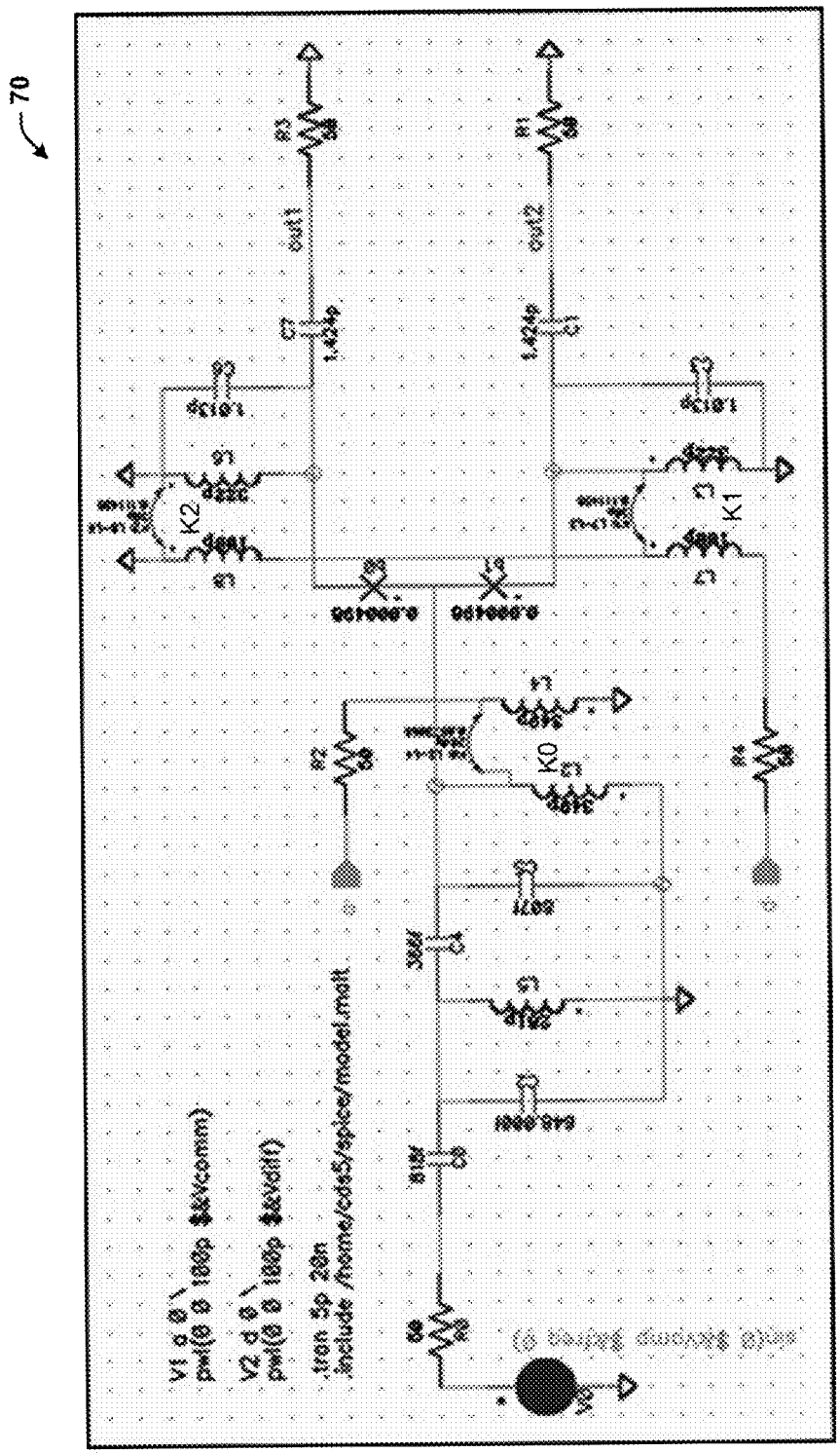
FIG. 6 illustrates a schematic circuit of another example of a single-pole double-throw switch circuit residing in a different filter design to utilize in a simulation.

FIG. 6 illustrates another example of a schematic circuit of a single-pole double-throw switch circuit 70 residing in a different filter design to utilize in a simulation. FIG. 6 shows the complete circuit 70 including Josephson junctions b0 and b1 and flux bias ports labeled "a" and "d". The common mode flux bias line is fed from port "a" through inductor L4 and is coupled to the common inductor L2 (ref $L_{COM}$ in FIG. 2) via transformer K0. The differential mode flux bias is fed from port "d" via inductors L7 and L8 and coupled to inductors L3 and L6 (ref inductors $L_1$ and $L_2$ in FIG. 2) via transformers K1 and K2. The circuit can be simulated in WRSpice, which is a circuit simulator that accurately models the behavior of Josephson junctions and superconducting circuits.

Figure 7:
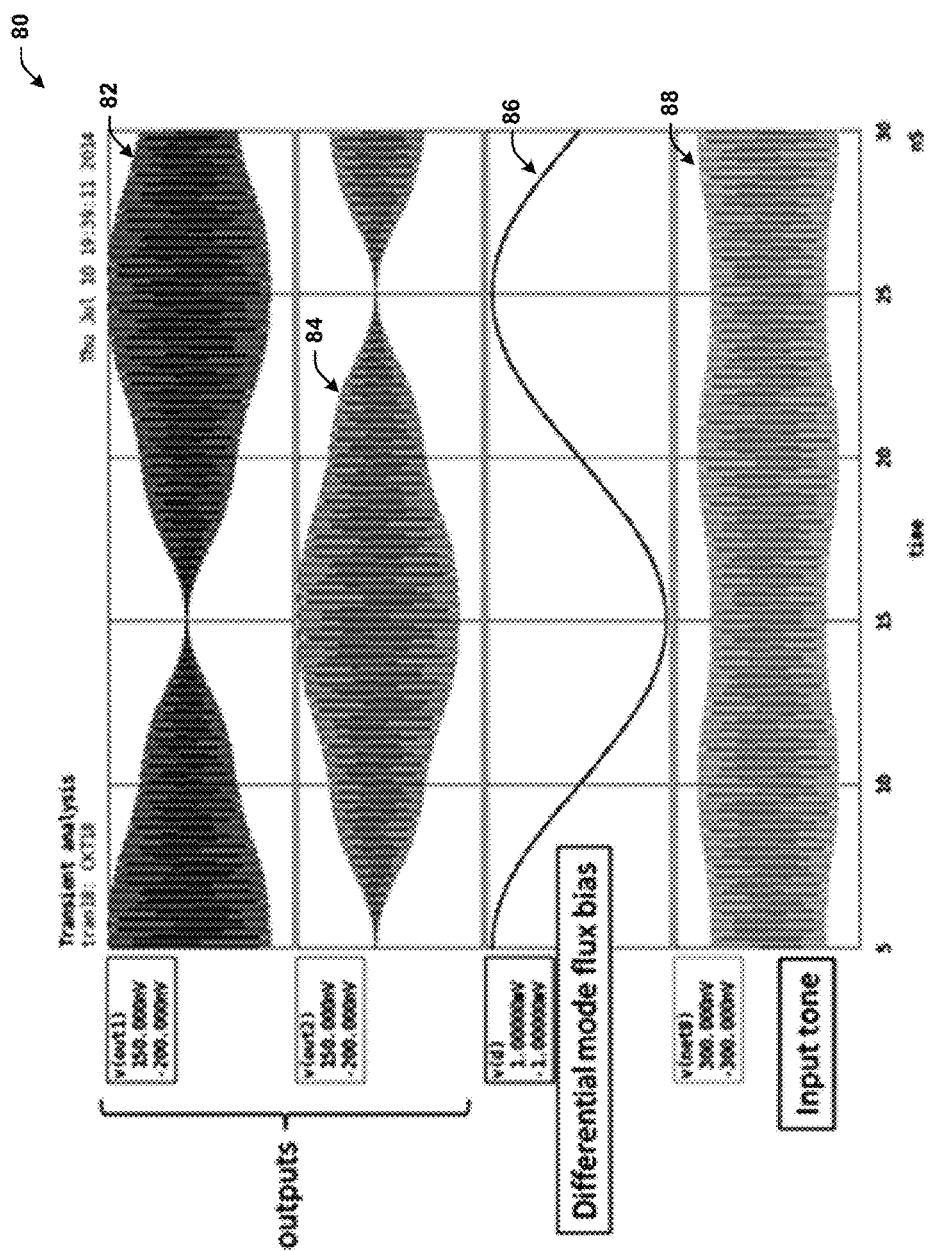
FIG. 7 illustrates a set of WRSpice simulation results of the circuit of FIG. 6.

FIG. 7 illustrates a set of WRSpice simulation results 80 of the circuit 70 of FIG. 6. An input signal 88 was provided that is a $-120$ dBm tone at 10 GHz, a DC common mode flux (not shown) was applied via port "a", and an oscillating differential flux 86 was applied via port "d", so that the fluxes associated with a first SQUID and second SQUID of circuit 70, correspond to $\Phi_1$ and $\Phi_2$ as shown in FIG. 2, oscillate between 0 and 0.365 $\Phi_0$. A first plot 82 illustrates the voltage at the first output port (out1) and a second plot

84 illustrate the voltage at the second output port (out2) of the circuit 70, showing that the input signal 88 is routed alternatively to port 1 as shown in the first plot 82 or port 2 as shown in the second plot 84 in response to the change in polarity of the oscillating differential flux 86.

In one example of a possible application, the single-pole double-throw switch can be integrated with an RQL flux pump to provide the differential mode flux that toggles the switch between the two output settings. The flux pump and switch assembly may further be integrated with a superconducting qubit circuit. Such a system can provide a microwave pulse selectively to one of two qubits conditioned, for example, on the result of a measurement of a third qubit, thus implementing a conditional quantum gate. In another possible example application, the switch can be configured to apply microwave readout pulses to different groups of qubits in a sequence, under the control of an RQL processor. Yet a further example application involves connecting the switch in reverse, to select one output out of two input paths. This configuration allows, for example, supplying two signals of different frequencies (within the filter's pass band) to the switch inputs and selecting one of these two frequencies to propagate to the output. Two single-pole double-throw switch switches as disclosed here may be operated in tandem to select one of two signal paths in an integrated microwave circuit, each path having for example a different time delay or a narrow-band frequency response.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting switch system comprising:
   a filter network comprising a first Superconducting Quantum Interference Device (SQUID) coupled to a second SQUID via a common node;
   an input port coupled to the common node;
   a first output port coupled to the first SQUID;
   a second output port coupled to the second SQUID;
   a common mode flux bias line inductively coupled to the first and second SQUIDs and to induce a common mode flux in each of the first SQUID and second SQUID based on a first biasing current flowing through the common mode flux bias line;
   a differential mode flux bias line to induce a first differential mode flux in the first SQUID and a second differential mode flux in the second SQUID based on a second biasing current flowing through the differential mode flux bias line; and
   a switch controller configured to control an amount of induced current through the first SQUID and the second SQUID based on both the first and the second biasing currents to alternately switch the first and second SQUIDS between first inductance states in which a desired bandwidth portion of a signal provided at the input terminal passes to the first output terminal and is blocked from passing to the second output terminal, and second inductance states in which the desired bandwidth portion of the input signal passes to the second output terminal and is blocked from passing to the first output terminal.

2. The system of claim 1, wherein the first SQUID is formed of a first inductor, a first Josephson junction and a common inductor, and the second SQUID is formed of the common inductor, a second Josephson junction and a second inductor.

3. The system of claim 2, wherein the first inductance states are when the first Josephson junction has a relatively low inductance state and the second Josephson junction has a relatively high inductance state, and the second inductance states are when the first Josephson junction has a relatively high inductance state and the second Josephson junction has a relatively low inductance state.

4. The system of claim 2, further comprising one or more input resonators formed of the common inductor and one or more additional input impedance components, one or more first output resonators formed of the first inductor and one or more additional first output impedance components, and one or more second output resonators formed of the second inductor and one or more additional second output impedance components.

5. The system of claim 4, wherein the one or more additional input impedance components, the one or more additional first output impedance components, and the one or more additional second output impedance components each comprise at least one capacitor.

6. The system of claim 1, wherein the switch controller controls an amount of the first biasing current through the common mode flux bias line and an amount of the second biasing current through the differential mode flux bias line and the polarity of current through one of the common mode flux bias line and the differential mode flux bias line, wherein the changing of polarity of current changes the selection between routing the input signal between the input port and the first output port or routing the input signal between the input port and the second output port.

7. The system of claim 1, wherein the switch controller provides the first and the second biasing currents and polarity of the first and the second biasing currents to the common mode flux bias line and the differential mode flux bias line when selecting a path that results in one of the first SQUID and second SQUID having a net flux of approximately zero and the other of the first SQUID and second SQUID having a net flux of about $0.1\ \Phi_0$ to about $0.45\ \Phi_0$, where $\Phi_0$ is equal to a flux quantum.

8. The system of claim 1, further comprising a first coupling capacitor coupled between the input terminal and the common node, a second coupling capacitor coupled between the first output terminal and the first SQUID, and a third coupling capacitor coupled between the second output terminal and the second SQUID, wherein the first, second and third coupling capacitors assure that currents that flow through the first and second SQUIDs are isolated from flowing though other parts of the system.

9. A method of operating a superconducting switch, the method comprising:
   applying a first biasing current through a common-mode flux bias line that is inductively coupled to first and second Superconducting Quantum Interference Devices (SQUIDs), the first SQUID being coupled to the second SQUID via a common node, to induce a common mode flux in each of the first SQUID and second SQUID;
   applying a second biasing current through a differential mode flux bias line that is inductively coupled to the first and second SQUIDs, to induce a first differential mode flux in the first SQUID and a second differential mode flux in the second SQUID, such that the first SQUID encloses a first total applied flux equal to the common mode flux minus the first differential mode flux and the second SQUID encloses a second total applied flux equal to the common mode flux plus the second differential mode flux;

controlling, using a switch controller, an amount of induced current through the first SQUID and the second SQUID based on both the first and the second biasing currents to alternately switch the first and second SQUIDS between first inductance states in which a desired bandwidth portion of a signal provided at an input terminal coupled to the common node passes to a first output terminal coupled to the first SQUID and is blocked from passing to a second output terminal coupled to the second SQUID, and second inductance states in which the desired bandwidth portion of the input signal passes to the second output terminal and is blocked from passing to the first output terminal.

10. The method of claim 9, wherein the first SQUID is formed of a first inductor, a first Josephson junction and a common inductor, and the second SQUID is formed of the common inductor, a second Josephson junction and a second inductor.

11. The method of claim 10, wherein the first inductance states are when the first Josephson junction has a relatively low inductance state and the second Josephson junction has a relatively high inductance state, and the second inductance states are when the first Josephson junction has a relatively high inductance state and the second Josephson junction has a relatively low inductance state.

12. The method of claim 10, wherein one or more input resonators are formed of the common inductor and one or more additional input impedance components, one or more first output resonators are formed of the first inductor and one or more additional first output impedance components, and one or more second output resonators formed of the second inductor and one or more additional second output impedance components.

13. The method of claim 12, wherein the one or more additional input impedance components, the one or more additional first output impedance components, and the one or more additional second output impedance components each comprise at least one capacitor.

14. The method of claim 9, further comprising controlling, with the switch controller, an amount of the first biasing current through the common mode flux bias line and an amount of the second biasing current through the differential mode flux bias line and the polarity of current through one of the common mode flux bias line and the differential mode flux bias line, wherein the changing of polarity of current changes the selection between routing the input signal between the input port and the first output port or routing the input signal between the input port and the second output port.

15. The method of claim 9, further comprising providing, with the switch controller, the first and the second biasing currents and polarity of the first and the second biasing currents to the common mode flux bias line and the differential mode flux bias line when selecting a path that results in one of the first SQUID and second SQUID having a net flux of approximately zero and the other of the first SQUID and second SQUID having a net flux of about 0.1 $\Phi_0$ to about 0.45 $\Phi_0$, where $\Phi_0$ is equal to a flux quantum.

16. The method of claim 9, wherein a first coupling capacitor is coupled between the input terminal and the common node, a second coupling capacitor is coupled between the first output terminal and the first SQUID, and a third coupling capacitor is coupled between the second output terminal and the second SQUID, and wherein the first, second and third coupling capacitors assure that currents that flow through the first and second SQUIDs are isolated from flowing though other parts of a system comprising the SQUIDs, terminals, flux bias lines, and common node.

\* \* \* \* \*